United States Patent [19]
Okamura et al.

[11] Patent Number: 4,641,034
[45] Date of Patent: Feb. 3, 1987

[54] ION IMPLANTATION APPARATUS AND METHOD FOR MASKLESS PROCESSING

[75] Inventors: Shigeru Okamura, Ebina; Takao Taguchi, Isehara, both of Japan

[73] Assignee: Fujitsu Limited, Kanagawa, Japan

[21] Appl. No.: 687,225

[22] Filed: Dec. 28, 1984

[30] Foreign Application Priority Data

Dec. 29, 1983 [JP] Japan ............................. 58-251453

[51] Int. Cl.$^4$ ............................................. G01N 23/00
[52] U.S. Cl. .................................. 250/492.2; 250/398
[58] Field of Search ...................... 250/492.2, 309, 398

[56] References Cited

U.S. PATENT DOCUMENTS 4,421,988 12/1983 Robertson et al. ............... 250/492.2
4,433,247 2/1984 Turner ............................. 250/492.2
4,517,465 5/1985 Gault et al. ...................... 250/492.2

Primary Examiner—Bruce C. Anderson
Attorney, Agent, or Firm—Armstrong, Nikaido, Marmelstein & Kubovcik

[57] ABSTRACT

This invention relates to an ion implantation apparatus and method for maskless processing of substrate, and more particularly, to form ion implanted pattern by selectively scanning a focused ion beam on the surface of a processing substrate. The timing of the apparatus is controlled by a variable frequency clock pulse. By using the variable frequency oscillator, a clock frequency can be controlled continuously. So, the ion implantation pattern is easily controlled by the clock frequency and scanning number with high accuracy compared to a prior art.

7 Claims, 7 Drawing Figures

ION IMPLANTATION APPARATUS AND METHOD FOR MASKLESS PROCESSING

BACKGROUND OF THE INVENTION

The present invention relates to ion implantation of selected impurities or dopants into a substrate of semiconductive material without utilizing a mask, and more particularly, to form ion implanted pattern by selectively scanning focused ion beam on the surface of a processing substrate. It provides a high precision device, capable of achieving the critical accuracies required by large scale integration.

In the production of elemental devices such as transistor, in a large scale integration (LSI) circuit, it is generally necessary to introduce dopants or impurities into the crystal structure of a semiconductor material. These dopants must be introduced in a specific configuration and within very close tolerances. Introducing the impurities in the required patterns and achieving the desired resolution has proven to be a difficult problem. Impurities have been diffused through a mask which has been formed into a desired configuration by photolithographic processes on the substrate. However, this method allows the dopants to migrate laterally under the mask, thus adversely affects to resolution. The diffusion method also requires multi-step photolithographic processes which are time consuming and expensive. One solution to minimize the adverse resolution by the diffusion is to introduce impurity by means of ion implantation. With ion implantation, the dopant material is ionized and then accelerated into a target substrate through a mask which defines the desired pattern.

Ion implantation methods of the prior art have generally required the use of masks, and it is customary to use an ion beam to implant dopants through a mask placed either directly upon or spaced some distance from the target substrate. Ion implantation with the mask located directly on the substrate, though reducing the lateral migration associated with the diffusion, still is subject to the costs of the photolithographic process.

On the other hand, ion implantation through an apertured mask spaced from the substrate, eliminates the necessity of masking and etching step; however, new problems occurs in this approach. Because of the necessity of providing supports for the mask, certain configurations may not be obtained by use of masks spaced from the target substrate. For example, using a mask which is spaced from the substrate, it is impossible to implant dopants in an annular or other closed-loop pattern in a single step since the supports for the mask will cast a shade of itself on the substrate. The prior art has recognized the need for a method of ion implantation which avoids these difficulties and thus, maskless ion implantation system have been proposed.

To clarify the advantages of the present invention over the prior art, a prior process, as illustrated in FIG. 1 through FIG. 2, will be described briefly. FIG. 1A is a schematic plan view of the layout of a conventional gallium arsenide (GaAs) field effect transistor (FET). The FET has a gate electrode G, a source region S, a drain region d and channel region C. A distance from a source S to a drain d is a channel length. It has previously been proposed high performance devices typically having channel lengths of 3-6 microns.

As the scale of integration of semiconductor device increased, minimum dimension of patterns become less than a micron. In such high precision device, it is necessary to attain the critical accuracies of the device.

FIG. 1B is a schematic plan view illustrating a focused ion beam scanning. Ions are implanted into the substrate area S, by scanning the ion beam b with a pitch P, for example 0.05 to 0.1 $\mu$m, on the substrate expose and step operation. It is reported that an ion implanted pattern has been formed by selectively scanning the focused ion beam at the beam diameters range from about 0.1–1.0 $\mu$m without utilizing a mask.

FIG. 2 is a schematic block diagram illustrating a prior art apparatus for selectively implanting dopants or impurity ions into a substrate of semiconductor material without utilizing a mask. Generally, the apparatus comprises five main sections:

1. Ion source and focusing system
2. High voltage source
3. Low voltage source
4. Stage for substrate and vacuum system
5. Computer and peripherals But, the detailed description of each elements are omitted because they are common in the art.

FIG. 2, illustrates general configuration of ion implantation system. Ions emitted from liquid metal ion (LMI) source 1 are controlled by an ion control electrode 2, beam alignments 4a, 4b, and 4c, and a blanking electrode 6. And filtered by E×B mass filter 7a which selects the ion and purity of the dopant by electric and magnetic cross field and mass separator slit 7b, finally the doping ions are focused onto a target 12 with approximately unitary magnification. Typically, the doping ions have been focused to spot diameters ranging from 0.1 to 3.0 $\mu$m at about 50 keV with a constant current density of 0.5 (A-/cm$^2$). In addition to focusing, the lens 3, 5, and 8 also accelerate or decelerate the ion beam. The final beam energy at the target 12 on the stage 11 can be varied from 40 to 200 keV. The ion source 1 is movable to align the ion beam with the electro-optical axis of the lens.

The deflector 9 is used to electrostatically scan the ion beam across the target 12 and for calibrating astigmatism. A 100 keV ion beam can be deflected over the entire scan field of 500 $\mu$m retaining a 0.1 $\mu$m diameter of focused beam. A central processing unit (CPU) 21 controls an ion beam system of the apparatus. The CPU 21 receives an input data which includes pattern data 22 and doping data 23 stored in magnetic tape, and data coming from probe 10 for ion current measuring. Then the CPU 21 generates control signals to the element of the apparatus to control the system, such as the lens system, a faraday cup 10, the stage 11, and a pattern generator 24.

The implantation dose D (ions/cm$^2$) is given by:

$$D = \frac{I_p \cdot T}{K \cdot S \cdot q} \quad (1)$$

where, $I_p$ is ion current (A), K is charge state of ions, S is an area of implanted region, and q is an electric charge unit (1.602×10$^{-19}$ coulomb). Therefore, the implantation dose D (ions/cm$^2$) is controlled by ion current Ip and ion implanting time T.

Generally, the ion beam is scanned step by step (not continuously) as shown in FIG. 1B. Area S for ion implanted region is given as $$S = mP \cdot nP = mnP^2 \quad (2)$$

where, S is a target area, m and n are respectively number of clock pulse for scanning to X and Y direction of the target area. If clock frequency is fc, the scanning time t to scan an area S can be obtained by the following equation:

$$t = mn/fc \tag{3}$$

when charge state of ion beam k is one (K=1), an implantation dose $D_1$ in the area S in one scanning is given by $$D_1 = \frac{I_p \cdot t}{K \cdot S \cdot q} = \frac{I_p}{1.602 \times 10^{-19}} \times \frac{1}{fc \cdot P^2} \tag{4}$$

It is clear from the equation (4), the implanted dose numbers $D_1$ is proportional to the ion current Ip which varies proportionally with ion beam diameter and ion beam density, and inversely proportional to the clock frequency fc and squares of pitch ($P^2$).

Generally, in order to obtain the desired dose D (ions/cm$^2$), it is necessary N times repetition of scan the target. So, the dose is given as $$D = N \cdot D_1 \tag{5}$$

In the equations (4) and (5), the ion current Ip and the scanning number N must be controlled in order to obtain a desired dose D. But when ion current Ip is varied, the focus system must be adjusted in order to attain high resolution. So, it is very difficult to vary the ion current Ip in the prior art apparatus. On the other hand, the scanning of the ion beam is linked to the clock frequency and the clock frequency fc is fixed for prior art ion implantation apparatus. Therefore, the dose can be varied discretely by varying the number of scan N, and it is impossible to vary the dose D precisely.

In conventional ion implantation apparatus, the clock frequency fc has been determined by count down of a standard clock frequency. So the frequency can be varied discretely to $\frac{1}{2^n}$ times of the standard clock frequency. For example, for the standard clock frequency of 10 MHz, the clock frequency can be only selected to 10.0, 5.0, and 2.5, (MHz) etc. Since the clock frequency is not controlled continuously, the dose can not be controlled continuously.

SUMMARY OF THE INVENTION

It is a general object of the present invention to provide an improved apparatus for maskless ion implantation.

Another object of the present invention is to provide an ion implantation method having a desired dose can be controlled freely and continuously.

Further object of the present invention is to provide an ion implantation method having a desired dose can be easily changed for ion implantation.

Still further object of the present invention is to provide an ion implantation method having a dose can be varied without readjustment for focussing.

Foregoing objects are accomplished by the present invention. According to the present invention, a focused ion beam is measured to provide a beam current. The data of the beam current is applied to a control unit. The control unit receives a pattern data to be scanned and an implantation dosage data. By using the pattern data and dosage data, the control unit determines and outputs a data for clock frequency and a scanning number in order to provide a desired dosage. The clock frequency is the one of clock for moving or shifting the focused ion beam step by step during the beam scanning. For this purpose, variable frequency oscillator (V.F.O) is used for transforming the data for clock frequency into a clock frequency. Thus the scanning conditions are precisely controlled in order to attain the desired implantation dosage.

Other objects and advantages of the present invention will become apparent from the following detailed description taken in connection with the accompanying drawings.

BRIEF DESCRIPTION OF THE DRAWINGS

Same or like reference numerals denote the same or like parts through the drawings.

DETAILED DESCRIPTION OF PREFERRED EMBODIMENTS

The invention will now be described with respect to some embodiments referring to the accompanying drawings.

Figure 1A:
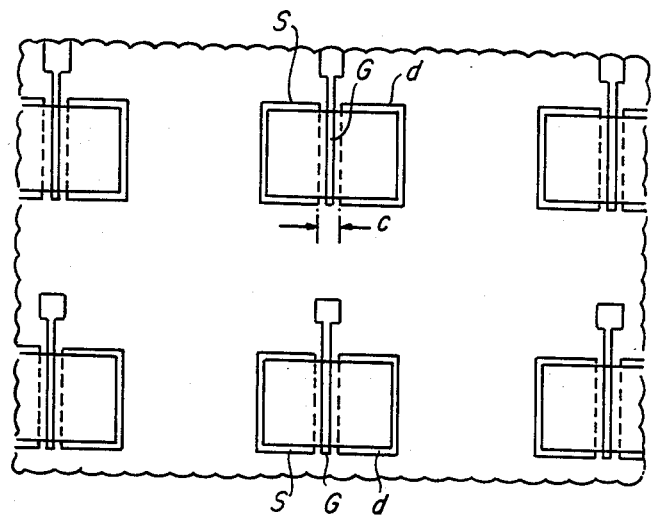
FIG. 1A is a schematic plan view of an exemplary pattern of a GaAs field effect transistor.
Figure 1B:
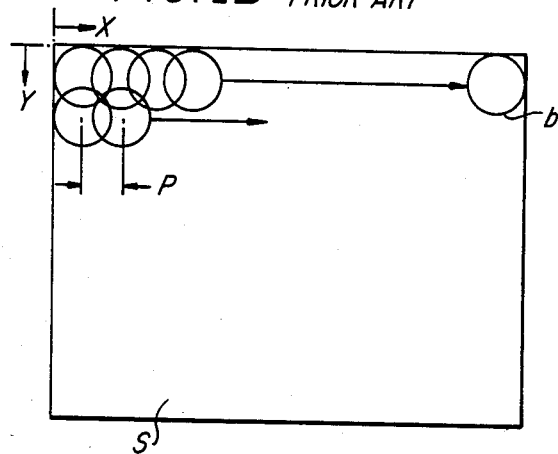
FIG. 1B illustrates a scanning of pattern on a surface of a substrate by focused ion beam without using a mask.
Figure 2:
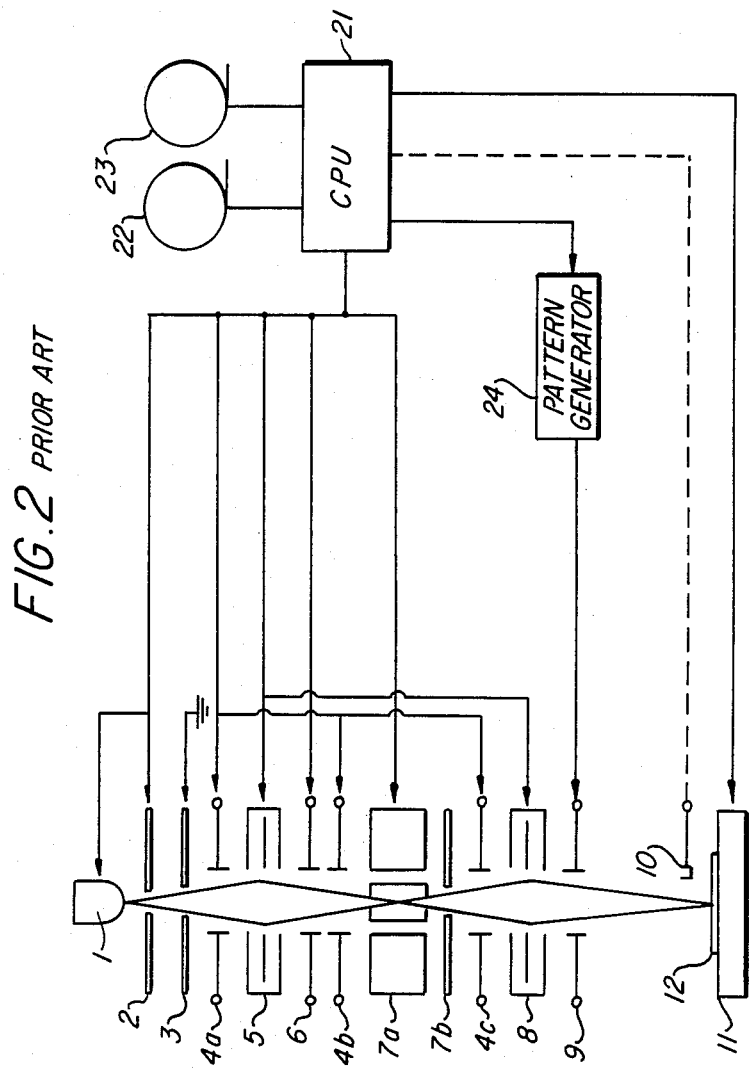
FIG. 2 is a schematic block diagram illustrating a control system of conventional ion implantation apparatus.
Figure 3:
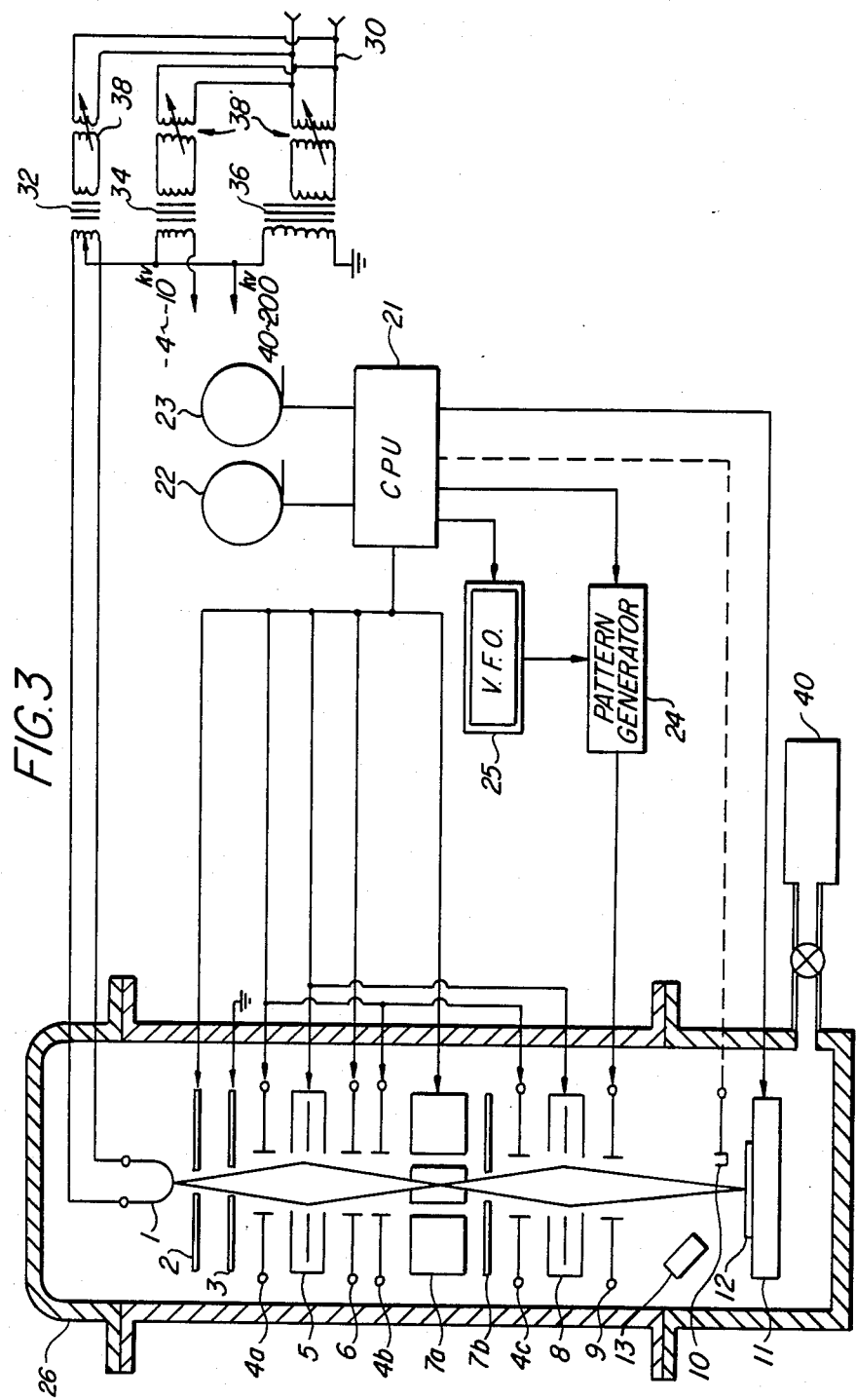
FIG. 3 is a schematic block diagram illustrating an improved ion implantation apparatus by the present invention.

FIG. 3 is a schematic block diagram illustrating an improved ion implantation apparatus by the present invention. The figure illustrates the basic element of a focused ion beam system of the apparatus corresponding to that of FIG. 2 of the prior art. Difference between the apparatus of FIG. 3 and FIG. 2 is that there is provided a variable frequency oscillator (V.F.O.) 25. The simplified operation of the present invention is based on adaptation of the a variable clock frequency.

In FIG. 3, same or like reference numerals denote the same or like parts to FIG. 2. The function of the focused ion beam system is to produce and deliver ions in the range of energies from 40 to 200 KeV to a target substrate 12. The ion beam system includes elements for deflecting the beam, analyzing, and separating the various ion species that constitute the beam.

The apparatus utilizes a liquid metal field emission ion (LMI) source 1 in a vacuum chamber 26. Oil-free components of a vacuum system 40 is used for all stages of pumping to insure cleanliness of the vacuum system. The source metal or alloy material, such as Ga, In, AuSi, and like, is stored in the reservoir and heated up to its melting point by the heater coil (not shown) controlled by a heater supply transformer 32. The ions emitted from the LMI source 1 are controlled by a control electrode 2, and accelerated by an accelerate electrode 3. Beam alignments 4a, 4b, and 4c are performed to align the ion beam with corrected electro-optical axis of the lens. First lens 5 and blanking deflector 6 are provided with a focusing action necessary for the EXB filter 7a. The blanking operation is performed by deflecting the beam away from the optical axis. The EXB filter 7a is a kind of the mass analyzer, which passes only ions having a predetermined charge/mass ratio (e/m) through the filter undeflected, while all others ions are deflected and stopped by a mass separation aperture 7b located below the analyzer.

Beam alignment 4c is used for correcting astigmatism. Second lens 8 and writing deflector 9 provides the focusing and writing scanning actions for the ion beam. The second lens 8 is the final imaging lens. The writing deflector 9 provides beam deflection over a field of approximately 500 $\mu m \times 500$ $\mu m$ on the target substrate 12 mounted on the stage 11. A 100 keV ion beam can be deflected over the entire scan field retaining a focused beam diameter of 0.1 $\mu m$. As the ion beam strikes the substrate 12, secondary electrons are emitted, the emitted secondary electrons are collected by a secondary electron detector 13. These electrons provide information for positioning the mark, as well as measuring the shape of the ion beam.

The probe 10, which is composed by a Faraday cup for example, mounted near the target substrate 12 detects the ion beam and returns its information back to the CPU. These data together with the input pattern data 22 and doping data 23 are transferred to the CPU 21 for storage and analysis. The CPU 21 generates signals corresponding to those data to control the ion beam system.

The high energy ions necessary for the ion implantation requires voltage up to 200 kV which is generated by "Cockcroft-Walton" type accelerator 34 and 36. The high voltage is supplied to a center tap of the secondary winding of transformers 32. The upper sections of the optical column (source, lenses, blanking, etc.) and their associated electronic apparatus are operated at the same potential of the high voltage. Each of the transformers are provided with a voltage adjustment circuit 38. And the power is supplied from AC input 30 of 95-128 volts 50 or 60 Hz. Above are a brief description of construction and operation of the apparatus. They are similar to prior art apparatus, therefore, details were omitted for the sake of simplicity.

Figure 4:
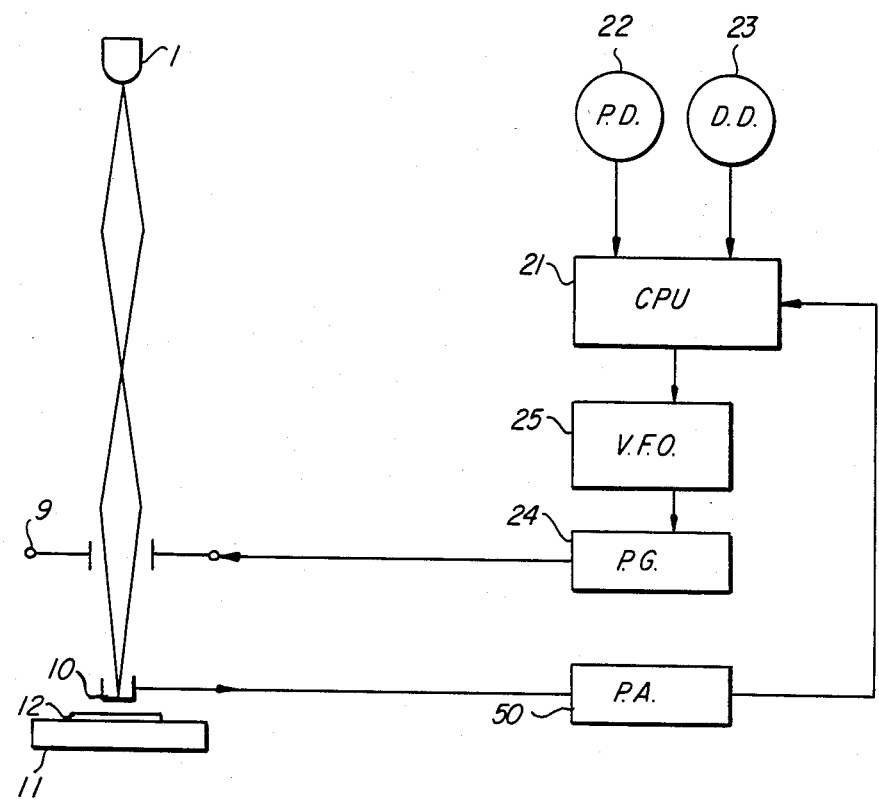
FIG. 4 is a schematic block diagram illustrating an improved control system of ion implantation apparatus by the present invention.

FIG. 4 is a schematic block diagram illustrating an improved control system of the present invention. The present invention is based on the variable frequency oscillator (V.F.O.) 25, which generates continuously variable frequency clock. In the figure, the ion beam current is collected by the Faraday cup 10 moved into the beam axis. The collected current is measured by pico ammeter (P.A.) 50 which converts analogue value into digital value. When such data are applied to the CPU 21, the clock frequency is calculated by the CPU 21 based on equation (4) referring the ion beam current, the pattern data 22 and doping data 23. Next, a voltage data corresponding to the calculated clock frequency is applied to the variable frequency oscillator (V.F.O.) 25. In the V.F.O. 25, the data voltages is converted to the clock frequency fc corresponding to the input voltage data. The pattern generator (P.G.) 24 is controlled by the clock frequency fc, and deflects the beam a pitch per one pulse of the clock pulse fc by the deflector 9.

The above mentioned V.F.O. 25 may directly output clock pulses having a desired frequency. However, it may be a type of two functions. That is a digital to analogue voltage conversion in a first stage and then the voltage is converted to a frequency ranging from 0 to 10 MHz corresponding to the input digital data of voltages. There are various kind of the V.F.O. applicable for the present use. For example, further details will be described in a following reference: "Model 458 and Model 460 specifications for the voltage to frequency converter"; published by ANALOG DEVICES, P.O. Box 280, Norwood, Mass. 02062 U.S.A.

Figure 5:
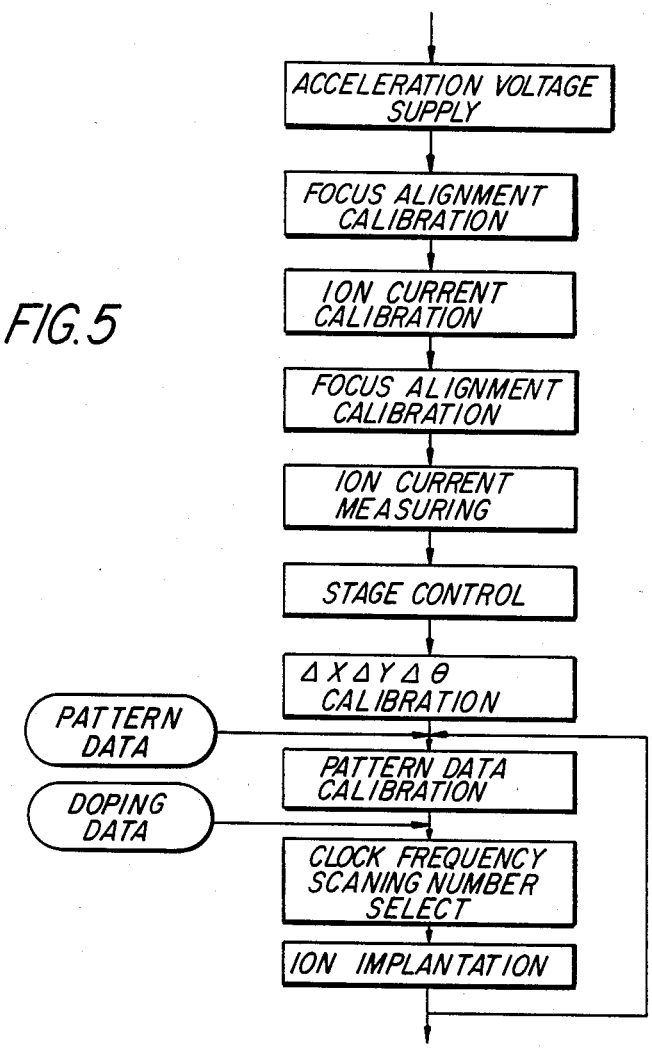
FIG. 5 is a flow chart for controlling an ion implantation apparatus by the present invention.

FIG. 5 shownws successive steps for the ion implantation process by the present invention: Acceleration voltage is set up so as to perform the implanted ion can provide a predetermined concentration profile in the target. Calibration of the focused beam is performed and the ion current is set up to a design value by the adjustment of the focus alignment. Under such condition, the ion current is measured by the Faraday cup moved into the beam axis as shown in FIG. 4. Next, a stage is moved to the position corresponding to the position data. Positionning error or setting error from a desired position (X, Y, and $\theta$) are calibrated by using a positioning mark on the substrate. Using the pattern data of the ion implantation region, the calibration of the position is performed again. Detail of these steps will not be given, because they are similar to those of the prior art.

From the ion current Ip and the dose conditions of the pattern, the clock frequency fc and scanning number N are determined as follows.

Figure 6:
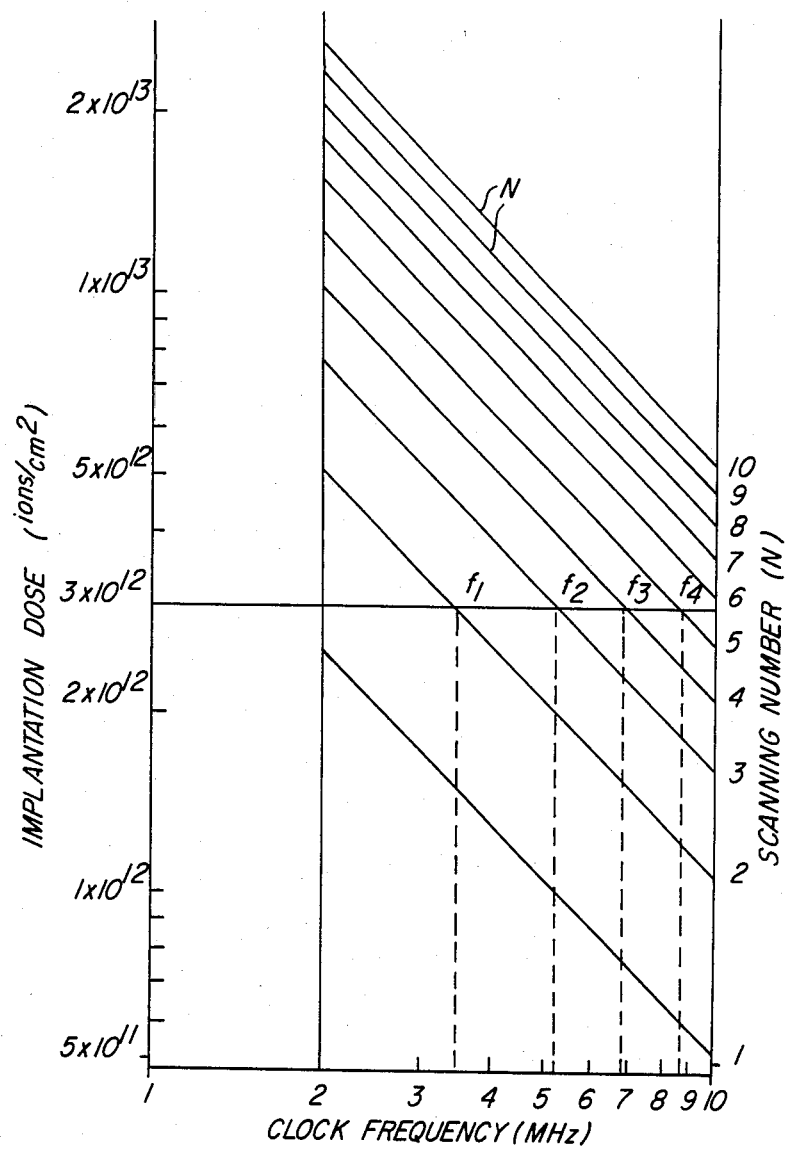
FIG. 6 is a diagram of illustrating a relation between clock frequency and scanning numbers for predetermined dose.

If the dose Do (ions/cm$^2$) to be implanted is given as $$Do = 3 \times 10^{12} (\text{ions/cm}^2) \quad (6)$$

and the ion beam diameter is 0.1 $\mu m$, and pitch P is determined to 0.06 ($\mu m$/clock) for example. From the equation (4) and (5), the dose D is given as $$D = 6.24 \times 10^8 \cdot \frac{N \cdot I_p}{fc \cdot p^2} \quad (7)$$

and when the measured ion current Ip is 30.0 (pA), for example, the dose D is expressed graphically as shown in FIG. 6. In the drawing, the horizontal line denotes the clock frequency fc (MHz). Vertical line in the left side axis denotes the dose (ions/cm$^2$) and slanted parallel line N designate the repetition number of scanning to implant the desired doping.

From FIG. 6, it will be seen that there are severed combinations of the clock frequency fc (X axis) and scanning numbers N (right side axis). For example, to obtain the desired dose Do of $3 \times 10^{12}$ (ions/cm$^2$), there are combinations of $f_1 = 3.47$ (MHz), N=2; $f_2 = 5.20$ (MHz), N=3; $f_3 = 6.93$ (MHz), N=4; and $f_4 = 8.67$ (MHz), N=5. Such combination data, for example, $f_1 = 3.47$ (MHz), N=2 mean that scanning frequency $f_1$ is 3.47 (MHz), and scanning should be performed twice. The frequency point fn is determined by the intersection of the slanted parallel line N, and the required dose line (horizontal line). So, it is possible to obtain the desired dose $Do = 3.0 \times 10^{12}$ (ions/cm$^2$), by several number of clock frequencies $f_1, f_2, f_3 \ldots f_n$. Among of them any one frequency can be selected. But practically there is other category to select the clock frequency fc. One is the implantation damage. If too many impurity is implanted at a single scan of the beam, the substrate is damaged. According to the experimental result, combination of $f_4=8.67$ (MHz) and N=5 was most suitable to minimize the ion implantation damage.

The following example illustrates a preferred application of ion implantation apparatus by the present invention. The apparatus can be applied to fabricate a device having an enhancement mode and a depletion mode FETs on a same chip. Each of the channel regions must have a different dose. In this case, using the variable frequency oscillator (V.F.O.) of the present invention, it is possible to implant the impurities in such channels with high accuracy by a selected combination of the clock frequency fc and the scanning number N. If it is used a prior art apparatus for such application, it is impossible to vary the dose for each FETs. So, it will be clear the advantage of the present invention to extend the variety of applications in the field of semiconductor device fabrication.

It is quite desirable to provide a channel doping region having controlled doping concentration in a surface for the fabrication of above mentioned MESFET. More specifically, relatively high doping concentration between the source and the gate would afford the decrease the input resistance and relatively low doping concentration between the gate and the drain would increase the drain withstanding voltage and also decrease the gate to drain stray capacitance. Although, this is just one example, it is desirable to control the doping concentration within a selected surface for the specific type of semiconductor device.

This is also accomplished by the present invention. Since scanning speed is determined by the clock frequency applied to the pattern generator 24, the clock frequency is then precisely controlled to provide the desired doping concentrations within a selected surface region. For example, if the doping concentration is required to gradually increase only in the direction of X axis of the selected surface region, Y-deflector is controlled to operate with the scanning frequency corresponding to a doping concentration at each selected position of the X axis.

In the above explanation the cross section of the ion beam has been assumed to have a circular form, but the present invention can be applied to any form of ion beams, for example, a rectangular beam can be applicable.

Although only one of the GaAsFETs embodiment of the invention has been disclosed and described, it is apparent that other semiconductor are also applicable and embodiments and modification of the invention are possible.

We claim:

1. A method of processing a substrate by selective ion implanting directly to patterns on the substrate using a focused ion beam without using masks and scanning a focused ion beam in a step by step movement, said method comprising the steps of:
   determining the starting and ending points of said scanned substrate
   measuring an ion beam current by a probe;
   selecting a clock frequency from an output frequency of a variable frequency oscillator whose frequency can be varied continuously, said clock frequency for scanning said focused ion beam in a step by step movement and a scanning number based upon said measured ion current for providing a predetermined dosage; and
   performing said processing of said substrate with said ion beam by the selected combination of said clock frequency and said scanning number.

2. The method of claim 1, wherein said ion beam current is measured by using a Faraday cup as one of said probe.

3. The method of claim 1, wherein said clock frequency is supplied with a variable frequency oscillator.

4. The method of claim 1, wherein said scanning number is determined for minimizing the implantation damage.

5. An apparatus for implanting a dopant material into a substrate of semiconductive material by selective ion implanting directly to patterns on the substrate using a focused ion beam without utilizing a mask, said apparatus comprising:
   a focused controlling system focusing an ion beam;
   a deflector deflecting and scanning said ion beam from a determined starting and ending point on said substrate;
   means for measuring said emitted ion beam current;
   a pattern generator connected to said deflector for applying a deflection voltage to said deflector;
   a continuously variable frequency oscillator generating a clock signal having a frequency which determines reflection speed to said pattern generator; and
   a central processing unit (CPU) system determining said clock frequency and scanning number based upon said measured ion current, which corresponding to a predetermined implantation dosage, said CPU controlling said continuously variable frequency oscillator in order to generate said clock frequency, and said CPU controlling said deflector by said clock frequency and scanning number.

6. The apparatus of claim 5, further comprises an electric field generator by which said dopant ions are accelerated.

7. The apparatus of claim 5, wherein said central processing unit (CPU) controls a focused ion beam system of said apparatus.

* * * * *